United States Patent
Kirihata et al.

(10) Patent No.: US 6,185,712 B1
(45) Date of Patent: Feb. 6, 2001

(54) CHIP PERFORMANCE OPTIMIZATION WITH SELF PROGRAMMED BUILT IN SELF TEST

(75) Inventors: Toshiaki Kirihata, Poughkeepsie; Christopher Douglas Wait, Beacon, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/109,145

(22) Filed: Jul. 2, 1998

(51) Int. Cl.⁷ ..................................................... G01R 31/28
(52) U.S. Cl. ............................................ 714/732; 714/724
(58) Field of Search ..................................... 714/732, 733, 714/724

(56) References Cited

U.S. PATENT DOCUMENTS

| | | |
|---|---|---|
| 5,161,232 | 11/1992 | Beran . |
| 5,291,425 | 3/1994 | Nagaishi . |
| 5,301,199 | 4/1994 | Ikenaga et al. . |
| 5,303,199 | 4/1994 | Ishihara et al. . |
| 5,355,509 | 10/1994 | Beran . |
| 5,361,264 | 11/1994 | Lewis . |
| 5,369,648 | 11/1994 | Nelson . |
| 5,398,250 | 3/1995 | Nozuyama . |
| 5,448,110 | 9/1995 | Tuttle et al. . |
| 5,459,737 | 10/1995 | Andrews . |
| 5,485,467 | 1/1996 | Golnabi . |
| 5,504,903 | 4/1996 | Chen et al. . |
| 5,509,019 | 4/1996 | Yamamura . |
| 5,553,082 | 9/1996 | Connor et al. . |

OTHER PUBLICATIONS

Hiroki Koike, et al., "A Bist Scheme Using Microprogram ROM For Large Capacity Memories," IEEE 1990 International Test Conference, Paper No. 36.1, pp. 815–822.

Toshio Takeshima, et al., "A 55–N5 16–MB DRAM With Built–In Self–Test Function Using Microprogram ROM, "IEEE Journal of Solid–State Circuits, vol. 25, No. 4, Aug. 1990, pp. 903–911.

Primary Examiner—Phung M. Chung
(74) Attorney, Agent, or Firm—McGuireWoods, LLP; Joseph P. Abate

(57) ABSTRACT

An integrated circuit (IC) chip wherein a built-in self test determines the IC's optimum electrical performance. A corresponding optimum performance setting is stored in NVRAM on the chip. Upon each chip power-up, the optimum performance setting is retrieved and provided to chip control which sets the chip for its best performance.

22 Claims, 3 Drawing Sheets

CHIP PERFORMANCE OPTIMIZATION WITH SELF PROGRAMMED BUILT IN SELF TEST

RELATED APPLICATIONS

The present invention is related to U.S. patent application Ser. No. 08/887,372 entitled, "DRAM with Self Programmed Built in Self Test" to Heidel et al., U.S. patent application Ser. No. 08/887,374 entitled, "Built in Self Test With Memory" to Kirihata et al., and U.S. patent application Ser. No. 08/887,462 entitled, "Method of Self Programmed Built in Self Test" to Heidel et al., filed Jul. 2, 1997 and assigned to the assignee of the present application.

BACKGROUND OF THE INVENTION

1. Field of the Invention

The present invention generally relates to Dynamic Random Access Memories (DRAMs) and, more particularly to DRAMs with Built In Self Test (BIST) Capability.

2. Background Description

State of the art Dynamic Random Access Memories (DRAM) and logic chips, such as microprocessors, may include Built In Self Test (BIST) capability. The BIST logic tests the DRAM or logic according to predefined tests to uncover any defective array elements.

Such a state of the art logic and DRAM is designed to function at what are defined to be worst case conditions. Normally, such a conservative worst case design includes some design margin to assure functionality that limits the microprocessor's or DRAM's actual performance to something less than the its full capability. Design margin verses performance is a trade off that designers must make at design to maximize chip manufacturing yield and guarantee chip functionality to specification.

Consequently, even though such a chip may include individual circuits capable of higher performance, its performance restricted by its slowest circuits. Further, even though some circuits might be selectively tuned in place, for an overall chip performance improvement, all circuits are set for the slowest circuits.

Thus, there is a need for integrated circuit chips wherein individual circuits may be tuned for optimum performance.

SUMMARY OF THE INVENTION

It is therefore a purpose of the present invention to improve integrated circuit chip performance.

It is another purpose of the present invention to improve DRAM performance and yield.

The present invention is an integrated circuit (IC) chip wherein a built-in self test determines the IC's optimum electrical performance. A corresponding optimum performance setting is stored in NVRAM on the chip. Upon each chip power-up, the optimum performance setting is retrieved and provided to chip control which sets the chip for its best performance.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

U.S. patent application Ser. No. 08/887,372 entitled, "DRAM with Self Programmed Built in Self Test" and U.S. patent application Ser. No. 08/887,462 entitled, "Method of Self Programmed Built in Self Test" both to Heidel et al., filed Jul. 2, 1997, assigned to the assignee of the present application and incorporated herein by reference, disclose a Dynamic Random Access Memory (DRAM) with Self Programmed Built in Self Test (SPBIST). U.S. patent application Ser. No. 08/887,374 entitled, "Built in Self Test With Memory" to Kirihata et al., filed Jul. 2, 1997, assigned to the assignee of the present application and incorporated herein by reference, discloses an integrated circuit chip that includes a DRAM with SPBIST that includes Non-Volatile Random Access Memory (NVRAM) for storing self test data and results.

For preferred embodiment integrated circuit (IC) chips, one test included in the self test finds the IC's optimum electrical performance. A corresponding optimum performance setting is stored in NVRAM, where upon each chip power-up, it is retrieved and provided to chip control to set the chip for its best performance.

Figure 1:
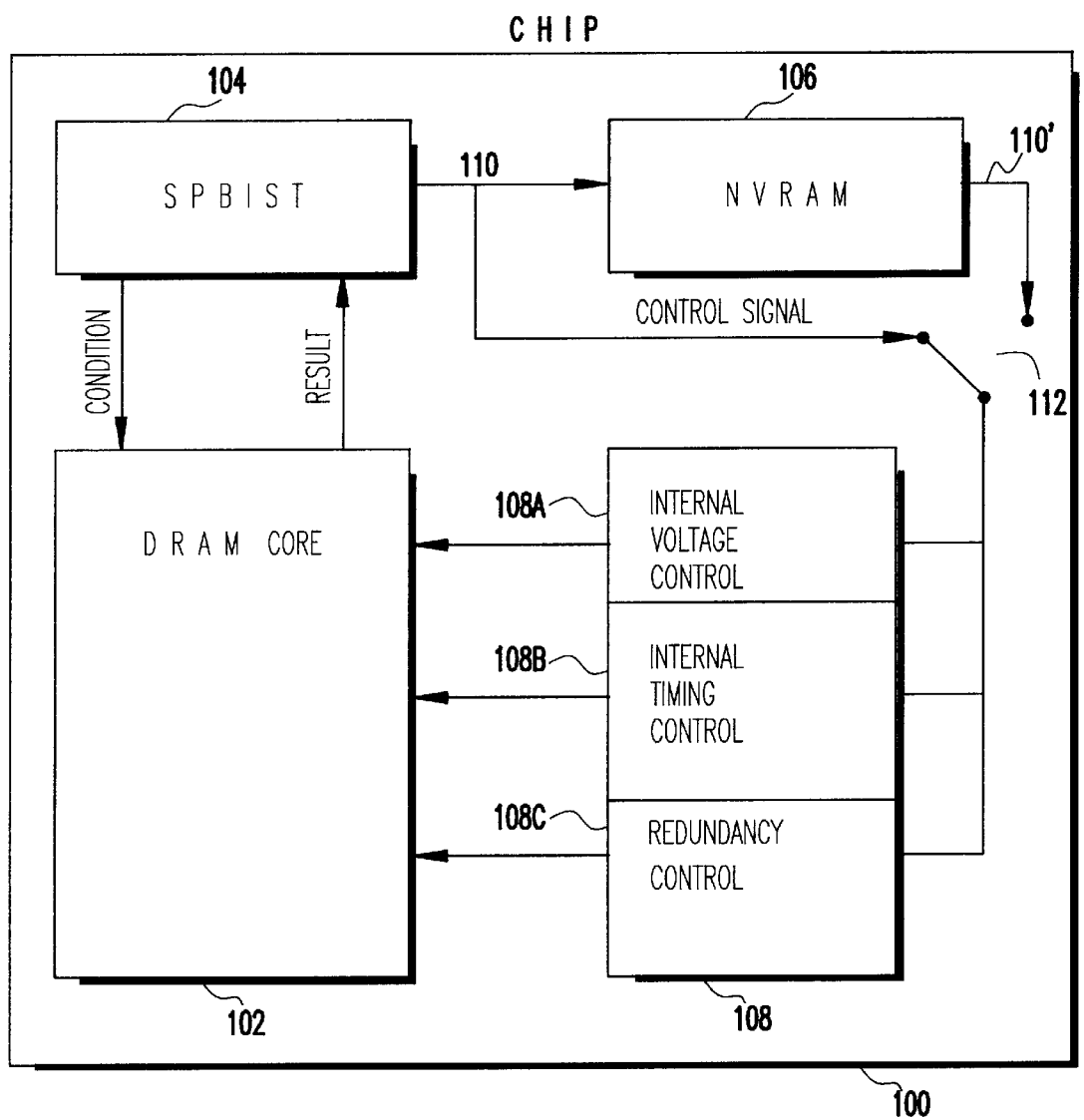
FIG. 1 shows a preferred embodiment chip 100 according to the present invention.

Thus, FIG. 1 shows a preferred embodiment chip 100 according to the present invention, which includes a random access memory (RAM) core 102, BIST logic 104 for testing the RAM 102, NVRAM 106 for storing test results and control logic 108 for selectively controlling RAM 102 operation. Although for the preferred embodiment, the chip includes a RAM core 102, logic, microprocessors or any other type of electronic system may be substituted. The RAM 102 is, preferably, DRAM and the BIST logic 104 is, preferably, SPBIST.

During self test, a condition is applied to the DRAM Core 102 by the SPBIST logic 104. The SPBIST logic 104 receives a result which may cause the SPBIST logic 104 to pass a control signal 110 to the control logic 108, modifying a control parameter. Three examples of such modifiable control parameters are: Internal Voltage 108A, Internal Timing 108B, and Redundancy 108C.

So, for example, nominal testing conducted by the SPBIST logic 104 at nominal DRAM Sense Amplifier (SA) timing may result in an expected result. The SPBIST logic 104 would increment the control signal 110 such that the Internal Timing Control shortens the SA timing to allow a faster access time. The same test would be repeated by the SPBIST logic 104 at faster SA timing and each time the test concluded in an expected result, the SPBIST logic 104 would increment the control signal 110. This test is rerun until the test fails, indicating the limit of SA timing has been exceeded and the last passing control signal 110 value, i.e. the chip's optimized value, is stored in the NVRAM 106.

Preferably, along with storing the optimized value, the test condition at that optimized value is also stored in the NVRAM 106. Thus, for example, if the DRAM chip tested has a nominal cycle time of 15 ns, but after testing, the optimized DRAM chip has a 14 ns cycle time, the 14 ns cycle time is also stored in NVRAM 106. This result may be retrieved from NVRAM 106 to eliminate the need for retesting to determine cycle time.

After having determined and stored, for example, the minimum SA timing value in NVRAM 106, upon each chip power up, the control switch 112 is set such that the NVRAM 106 supplies the control signal 110' to the respective control circuit. Thus, the control signal is tuned to the optimum performance setting for the preferred embodiment chip 100.

Figure 2:
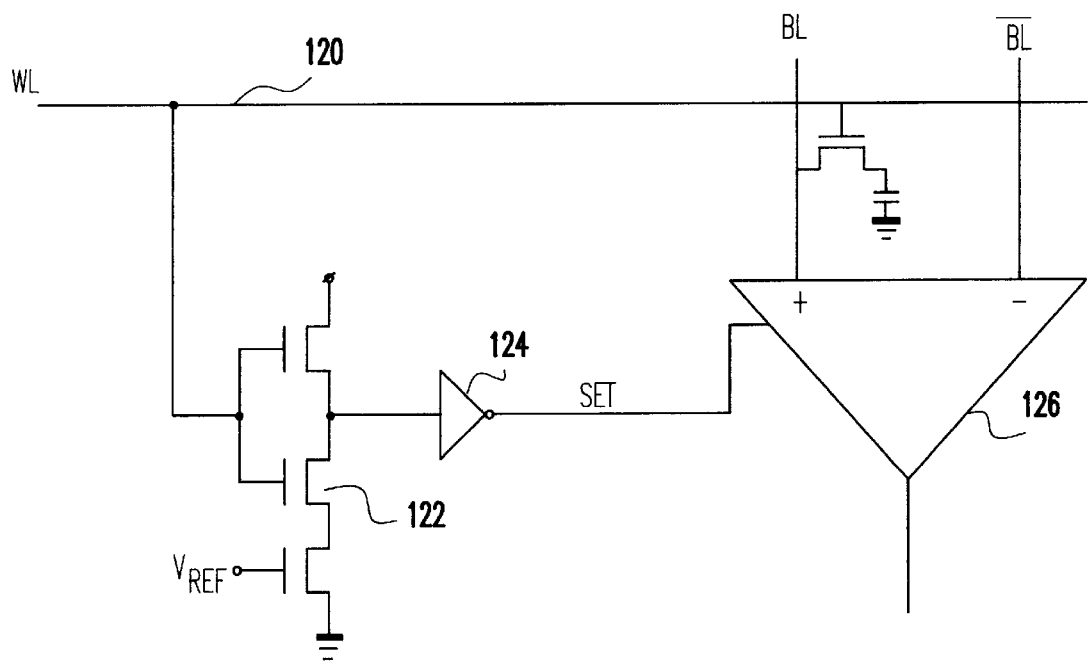
FIG. 2 shows a typical DRAM Sense Amp and SA timing delay circuit.
Figure 2:
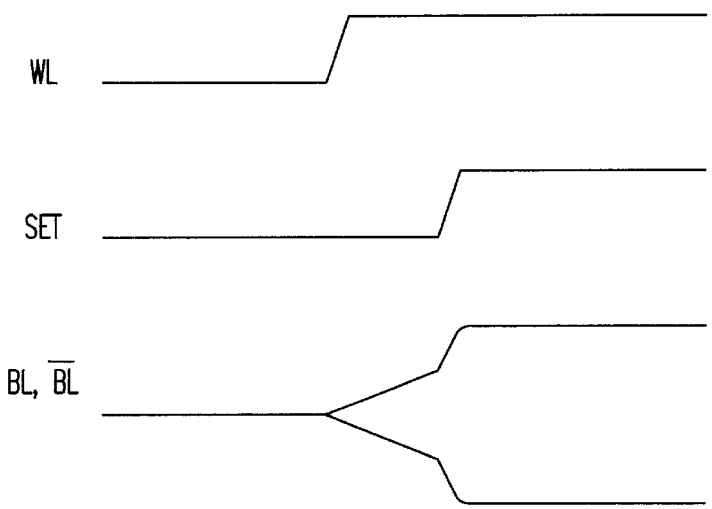

FIG. 2 shows a typical DRAM Sense Amp and SA timing delay circuit. The Word Line (WL) signal is provided to a word line 120 and a delay circuit 122. The delay circuit 122 is provided with a reference voltage ($V_{ref}$), which is controlled by control logic 108, but was fixed in prior art DRAMs. The propagation delay through the delay circuit 122 is dependent upon the voltage level of $V_{ref}$. The output of the delay circuit 122 is inverted by inverter 124, which provides the SET signal to Sense Amp 126. Thus, the SET signal is a delayed derivative of the WL signal.

In prior art designs, because $V_{ref}$ was fixed, the delay through the delay circuit 122 was chosen to guarantee that data on the Bit Line pair (BL and $\overline{BL}$) is good before the Sense Amp sets, i.e. set for the worst case. For these prior art designs, it was necessary to fix $V_{ref}$ because the minimum acceptable delay was never determined for each individual chip. So, to insure enough time is provided for charge stored in cells to stabilize on the Bit Line pair (BL and $\overline{BL}$) so as to avoid sensing false data, the worst case minimum delay (i.e. $V_{ref}$) was selected.

Figure 3:
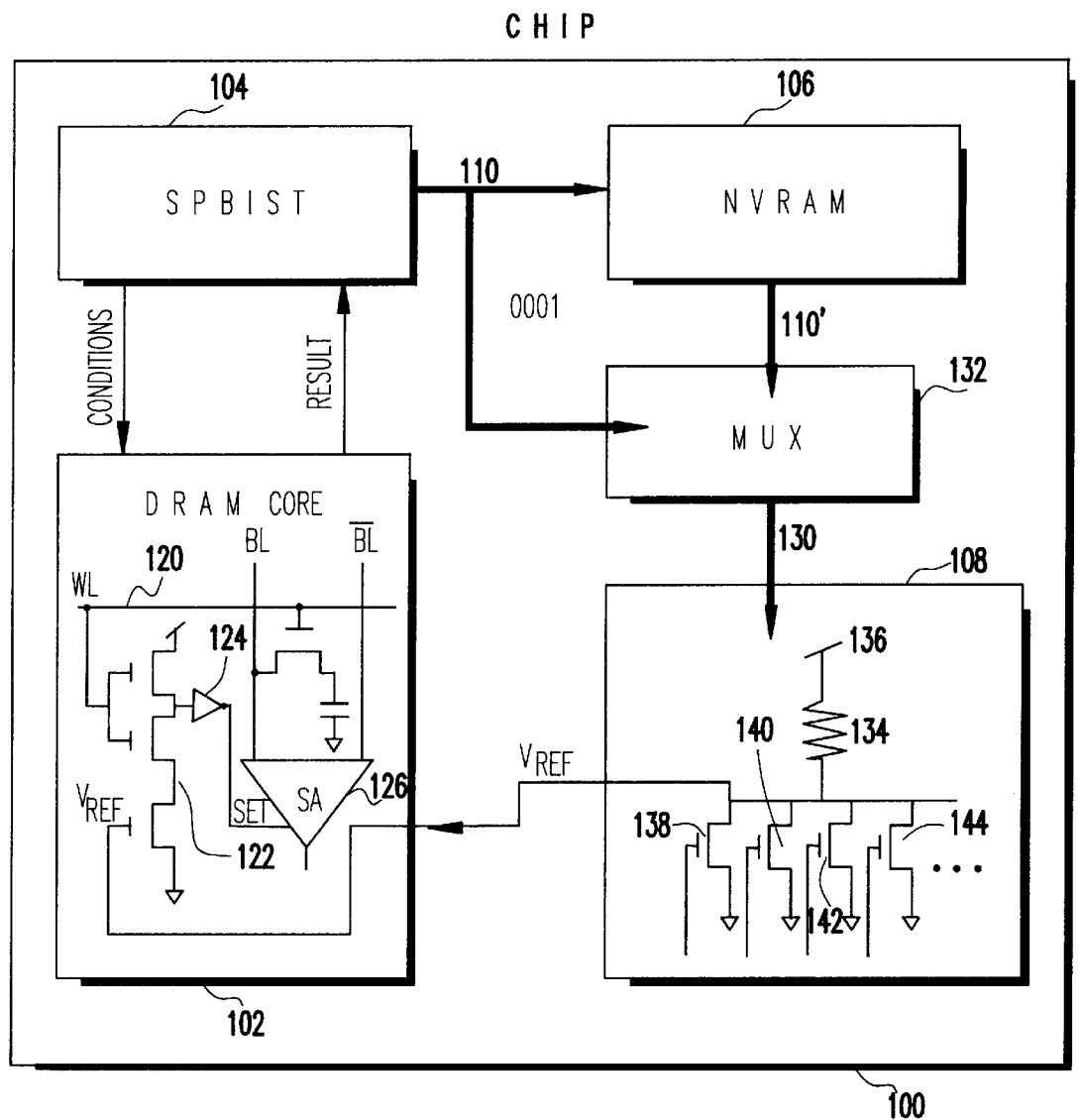
FIG. 3 is an example of the SA delay circuit in the preferred embodiment chip according to the present invention.

FIG. 3 shows an example of providing an adjustable $V_{ref}$ to the SA delay circuit 122 in a preferred embodiment DRAM chip according to the present invention. In this example of the preferred embodiment, $V_{ref}$ is a variable signal that is generated, digitally, by the control signal 130, which is passed through multiplexor (MUX) 132 from either the SPBIST logic 104 as 110 or the NVRAM 106 as 110'. MUX 132 provides the function of switch 112.

In this example, $V_{ref}$ is passed through resistor 134 from a supply rail 136 and, depends for its value upon the number of transistors 138, 140, 142 or 144 turned on or off by the digital control signal 130. The SPBIST logic 104 increments the delay reference level provided to the SET delay circuit 122 to adjust $V_{ref}$. The level of $V_{ref}$ sets the delay length for the set signal to the Sense Amp 126 and is decreased or increased by digitally incrementing or decrementing, respectively, the control signal 130. During self test, the optimum $V_{ref}$ setting is found and that setting (on 110) is stored in the NVRAM 106, preferably, along with chip operating parameters at that optimum $V_{ref}$ setting.

Upon subsequent power-ups, the MUX 132 selects the setting stored in the NVRAM 106, placing the chip into its optimum performance setting. The optimum performance setting, stored in NVRAM 106 remains unchanged, unless and until the chip 100 re-enters its self test mode.

It is contemplated that the self test performed on the preferred embodiment integrated circuit (IC) chips may include multiple parameter tests, each finding the IC's optimum electrical performance for particular parameter settings. A corresponding optimum performance setting may, then, be stored in NVRAM 106 for each parameter, whereupon at each chip power-up, the stored optimum performance settings are retrieved and provided to chip control 108 to set the chip 100 for its optimum performance.

So, for example, a control circuit 108 block may be included to dynamically trade performance for power dissipation. In this example, as power supply voltage increases to a preferred embodiment chip, digitally controlled voltage regulators and/or voltage pump supply circuits would be included to compensate, optimizing power against performance. Since both power dissipation and performance are important chip concerns, the SPBIST logic 104 may be used to find the optimum internal voltage by detecting circuit speed and current dissipation. After determining an acceptable current, the voltage may be set for a faster chip 100.

Yet another example where the preferred embodiment provides an advantage is in redundancy. Traditional redundancy is employed to replace bad cell locations. However, instead, weak or slow cells, normally treated as bad, may be identified and swapped for bad cells.

While the invention has been described in terms of preferred embodiments, those skilled in the art will recognize that the invention can be practiced with modification within the spirit and scope of the appended claims.

We claim:

1. An integrated circuit chip, comprising:
   a circuit;
   a Self Programmable Built In Self Test (SPBIST) logic connected to test said circuit, said SPBIST testing said circuit to determine an optimum performance parameter of said circuit;
   control logic providing control parameters for controlling operation of said circuit; and
   a non-volatile storage for storing the optimum performance parameter of said circuit as determined by said SPBIST, said non-volatile storage automatically providing the optimum performance parameter to said control logic during a subsequent power up of said circuit, said control logic controlling said circuit so that said circuit operates based on the optimum performance parameter.

2. The integrated circuit chip of claim 1, further comprising:
   means for selectively coupling said control logic to said SPBIST or said non-volatile storage responsive to whether said SPBIST is testing said circuit.

3. The integrated circuit chip of claim 2, wherein the optimum performance parameter is an internal voltage level of said circuit.

4. The integrated circuit chip of claim 2, wherein the optimum performance parameter is an internal timing of said circuit.

5. The integrated circuit chip of claim 2, wherein said circuit is a memory array.

6. The integrated circuit chip of claim 5 wherein said memory array is a dynamic random access memory (DRAM) array.

7. The integrated circuit chip of claim 6, wherein the optimum performance parameter controls redundancy of said DRAM.

8. The integrated circuit chip of claim 2, wherein SPBIST does not test said circuit during said subsequent power up.

9. A Dynamic Random Access Memory (DRAM), comprising:
   a DRAM core;
   Self Programmable Built In Self Test (SPBIST) logic connected to test said DRAM core, said SPBIST testing said DRAM core to determine an optimum performance parameter of said DRAM core;
   control logic providing control parameters for controlling operation of said DRAM core; and
   a non-volatile storage for storing the optimum performance parameter of said DRAM core as determined by said SPBIST, said non-volatile storage automatically providing the optimum performance parameter to said control logic during a subsequent power up of said circuit, said control logic controlling said DRAM core so that said DRAM core operates based on the optimum performance parameter.

10. The DRAM of claim 9, further comprising:

means for selectively coupling said control logic to said SPBIST or said non-volatile storage responsive to whether said SPBIST is testing said DRAM core.

11. The DRAM of claim 10, wherein the optimum performance parameter is an internal voltage level of said DRAM core.

12. The DRAM of claim 10, wherein the optimum performance parameter is an internal timing of said DRAM core.

13. The DRAM of claim 10, wherein the optimum performance parameter controls redundancy of said DRAM core.

14. An integrated circuit chip comprising:

a circuit core;

Built In Self Test (BIST) logic connected to test and control said circuit core during a test condition;

control logic providing control parameters to said circuit core responsive to said BIST logic during said test condition; and non-volatile storage receiving control information from said BIST logic during said test condition and providing control information to said control logic during a normal power up.

15. A method for tuning an integrated circuit chip for optimum performance, comprising:

testing a circuit on the chip to determine an optimum performance parameter of the circuit;

storing the optimum performance parameter in a memory on the chip;

supplying power to the chip: and setting the circuit to operate based on the optimum performance parameter stored in said memory, said setting step being automatically performed in response to said power supplying step.

16. The method of claim 15, wherein the circuit is a Dynamic Random Access Memory core and the optimum performance parameter sets sense amplifier timing.

17. The method of claim 16 wherein the testing step is a built in self test.

18. The method of claim 15, wherein said testing step includes:

inputting a first test condition into the circuit;

determining an initial performance result of the circuit based on the first test condition; and if said initial performance result does not exceed the predetermined limit, performing the following steps:

(a) incrementing the test condition, (b) inputting the incremented test condition into the circuit, (c) determining a performance result of the circuit based on the incremented test condition, and (d) if the performance result determined in step (c) exceeds the predetermined limit, storing the incremented test condition into said memory as the optimum performance parameter, and if the performance result in step (c) does not exceed the predetermined limit, repeating steps (a)–(d).

19. The method of claim 15, wherein the optimum performance parameter includes one of an internal operating voltage of the circuit, an internal timing of the circuit, and redundancy.

20. The method of claim 15, wherein the circuit is not tested to determine said optimum performance subsequent to said power supplying step.

21. A method for controlling operation of a DRAM, comprising:

testing a sense amplifier circuit of the DRAM to determine an optimum delay time for setting the sense amplifier;

storing the optimum delay time in a memory on the chip;

supplying power to the chip: and setting the sense amplifier circuit to operate based on the optimum delay time stored in said memory, said setting step being automatically performed in response to said power supplying step.

22. The method of claim 21, wherein said testing step includes:

inputting a first reference voltage into a timing delay circuit of the sense amplifier circuit;

determining an initial delay time of the sense amplifier circuit based on the first reference voltage;

if the initial delay time does not coincide with a desired value, performing the following steps:

(a) incrementing the first reference voltage, (b) inputting the incremented reference voltage into the circuit, (c) determining a delay time of the sense amplifier circuit based on the incremented reference voltage, and (d) if the delay time determined in step (c) matches the desired value, storing the incremented reference voltage into said memory as the optimum delay time, and if the performance result in step (c) does not match the desired value, repeating steps (a)–(d).

* * * * *